US012568590B2

(12) United States Patent
Kim et al.

(10) Patent No.: US 12,568,590 B2
(45) Date of Patent: Mar. 3, 2026

(54) DISPLAY DEVICE AND ELECTRONIC DEVICE INCLUDING THE SAME

(71) Applicant: Samsung Display Co., LTD., Yongin-si (KR)

(72) Inventors: Joo Young Kim, Yongin-si (KR); Dong Wan Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 19/078,465

(22) Filed: Mar. 13, 2025

(65) Prior Publication Data

US 2025/0393136 A1     Dec. 25, 2025

(30) Foreign Application Priority Data

Jun. 21, 2024     (KR) ........................ 10-2024-0081178
Jul. 12, 2024     (KR) ........................ 10-2024-0092464

(51) Int. Cl.
*H05K 5/00*          (2025.01)
*G06F 3/041*         (2006.01)
*G06V 40/13*         (2022.01)

(52) U.S. Cl.
CPC ........... *H05K 5/0018* (2022.08); *G06F 3/041* (2013.01); *G06V 40/13* (2022.01)

(58) Field of Classification Search
CPC ....... H05K 5/0018; G06V 40/13; G06F 3/041
See application file for complete search history.

(56) References Cited

U.S. PATENT DOCUMENTS

| | | | | |
|---|---|---|---|---|
| 9,893,093 B2 | | 2/2018 | Kim et al. | |
| 11,126,288 B2 | * | 9/2021 | Kim ...................... | H10K 59/40 |
| 2019/0302942 A1 | * | 10/2019 | Kim ...................... | H10K 59/88 |

FOREIGN PATENT DOCUMENTS

| | | | | | |
|---|---|---|---|---|---|
| CN | 109144320 A | * | 1/2019 | ............ | G06F 3/044 |
| KR | 102525124 B1 | | 4/2023 | | |

OTHER PUBLICATIONS

Machine translation of CN-109144320-A. (Year: 2025).*

* cited by examiner

*Primary Examiner* — Michael Pervan
(74) *Attorney, Agent, or Firm* — CANTOR COLBURN LLP

(57) ABSTRACT

A display device includes a display panel including a display area and one or more pad areas, a touch sensor disposed on the display panel and including a notch part, a polarizing layer disposed on the touch sensor and a printed circuit board disposed on the display panel and configured to overlap at least a part of the pad area, wherein the notch part is configured to extend in a first direction from the display area on a floor plan and to not overlap the pad area.

17 Claims, 16 Drawing Sheets

FIG. 2

| | |
|---|---|
| 80 | Cover window |
| 70 | Adhesive layer |
| 60 | Polarizing layer |
| 50 | Touch sensor |
| DP { 30 | Light emitting element layer |
| 20 | Pixel circuit layer |
| 10 | Base substrate |

NCA1: NCA1_a, NCA1_b
NCA': NCA1, NCA2
PCB_U1: PCB_SU1, PCB_SU2
PCB: PCB_U1, PCB_U2

NCA1: NCA1_a, NCA1_b
NCA': NCA1, NCA2
PCB_U1: PCB_SU1, PCB_SU2
PCB: PCB_U1, PCB_U2

NCA1: NCA1_a, NCA1_b
NCA': NCA1, NCA2
PCB_PA': PCB_PA1, PCB_PA2
DIC_PA': DIC_PA1, DIC_PA2

NCA1: NCA1_a, NCA1_b
NCA': NCA1, NCA2
PCB_U1: PCB_SU1, PCB_SU2
PCB: PCB_U1, PCB_U2

NCA1': NCA1_a, NCA1_b
NCA2': NCA2_a, NCA2_b
NCA": NCA1', NCA2'
PCB_PA": PCB_PA1', PCB_PA2', PCB_PA3
DIC_PA": DIC_PA1', DIC_PA2', DIC_PA3

NCA1': NCA1_a, NCA1_b
NCA2': NCA2_a, NCA2_b
NCA": NCA1', NCA2'
PCB_U1': PCB_SU1', PCB_SU2', PCB_SU3
PCB: PCB_U1', PCB_U2

| | |
|---|---|
| 80 | Cover window |
| 70 | Adhesive layer |
| 60 | Polarizing layer |
| 40 | Encapsulation layer |
| 30 | Light emitting element layer |
| 20 | Pixel circuit layer |
| 10 | Base substrate |

DP

1000

| 1010 | 1020 | 1030 |
|---|---|---|
| PROCESSOR | MEMORY DEVICE | STORAGE DEVICE |

| 1040 | 1050 | 1060 |
|---|---|---|
| I/O DEVICE | POWER SUPPLY | DISPLAY DEVICE |

DISPLAY DEVICE AND ELECTRONIC DEVICE INCLUDING THE SAME

This application claims priority to Korean Patent Application No. 10-2024-0081178, filed on Jun. 21, 2024, and 10-2024-0092464 filed on Jul. 12, 2024, and all the benefits accruing therefrom under 35 U.S.C. § 119, the contents of which in their entirety are herein incorporated by reference.

BACKGROUND

1. Field

The present invention relates to a display device and an electronic device including the same.

2. Description of the Related Art

With the development of information technology, the importance of display devices which are connection media between users and information has been highlighted. In response to this, the use of display devices, such as a liquid crystal display device, an organic light emitting display device, and a plasma display device, is increasing.

A display device may include a display panel and a touch sensor disposed to overlap the display panel and configured to receive a user's touch input or fingerprint information. For example, the touch sensor may be attached to one surface of the display panel or the touch sensor may be formed integrally with the display panel.

For recent display devices, research on minimizing a non-display area including a bezel of the display device or the thickness of the display device have been actively made.

SUMMARY

In one aspect of the invention, a display device and an electronic device may be provided, in which a printed circuit board is disposed directly on a display panel and thus a bezel area is relatively small with a relatively thin thickness.

A display device, according to an embodiment, includes a display panel including a display area and one or more pad areas, a touch sensor disposed on the display panel and including a notch part, a polarizing layer disposed on the touch sensor and a printed circuit board disposed on the display panel and configured to overlap at least a part of the pad area. The notch part is configured to extend in a first direction from the display area on a floor plan and not to overlap the pad area.

In an embodiment, the display device may further include one or more touch sensor pad areas disposed on the notch part.

In an embodiment, a thickness of the printed circuit board may not be larger than a sum of a thickness of the touch sensor and a thickness of the polarizing layer.

In an embodiment, the printed circuit board may include a first part configured to extend in an opposite direction to the first direction on the floor plan and to overlap the pad area and a second part configured to not overlap the pad area, wherein the first part may be configured to not overlap the notch part on the floor plan.

In an embodiment, each of the one or more pad areas may include a first pad area on which a driving IC chip is disposed and a second pad area configured to overlap the first part, wherein the first part may be configured to not overlap the first pad area on the floor plan.

In an embodiment, on the floor plan, a distance between one side of the second pad area that is most adjacent to the notch part and an outer side in a second direction that crosses the first direction on the first part may be equal to or larger than about 3.5 mm.

In an embodiment, a distance between one end of the notch part and the outer side may be at least equal to or larger than about 0.5 mm.

In an embodiment, the notch part may include first notch parts symmetrically disposed in a second direction that crosses the first direction and a second notch part disposed between the first notch parts.

In an embodiment, the second pad area may include a (2_1)-th pad area disposed between any one of the first notch parts and the second notch part and a (2_2)-th pad area disposed between the other of the first notch parts and the second notch part.

In an embodiment, the first part may include a first sub part configured to overlap the (2_1)-th pad area and a second sub part configured to overlap the (2_2)-th pad area.

In an embodiment, each of the one or more touch sensor pad areas may be disposed on an upper surface of each of the first notch parts.

In an embodiment, each of the one or more touch sensor pad areas may be disposed on an upper surface of the second notch part.

In an embodiment, the touch sensor pad area may include a plurality of touch sensor pads disposed in two rows.

In an embodiment, the touch sensor pad area may include a plurality of touch sensor pads disposed in three rows.

In an embodiment, the printed circuit board may be disposed directly on the display panel.

In an embodiment, a display device includes a display panel including a display area and one or more pad areas, an encapsulation layer disposed on the display panel and including a notch part, a polarizing layer disposed on the encapsulation layer and a printed circuit board disposed directly on the display panel and configured to overlap at least a part of the pad area. The notch part is configured to extend in a first direction from the display area on a floor plan and to not overlap the pad area.

In another embodiment, an electronic device according include a processor configured to provide input video data to a display device, wherein the display device is configured to display a video based on the input video data, wherein the display device includes a display panel including a display area and one or more pad areas, a touch sensor disposed on the display panel and including a notch part, a polarizing layer disposed on the touch sensor and a printed circuit board disposed on the display panel and configured to overlap at least a part of the pad area. The notch part is configured to extend in a first direction from the display area on a floor plan and to not overlap the pad area.

According to an embodiment, a display device and an electronic device is provided, in which a printed circuit board is disposed directly on a display panel and thus a bezel area of the display panel is relatively small with a relatively thin thickness.

BRIEF DESCRIPTION OF THE DRAWINGS

FIG. 2 is a cross-sectional view schematically showing a laminated structure of a display device, according to an embodiment.

3

4

Figure 3:
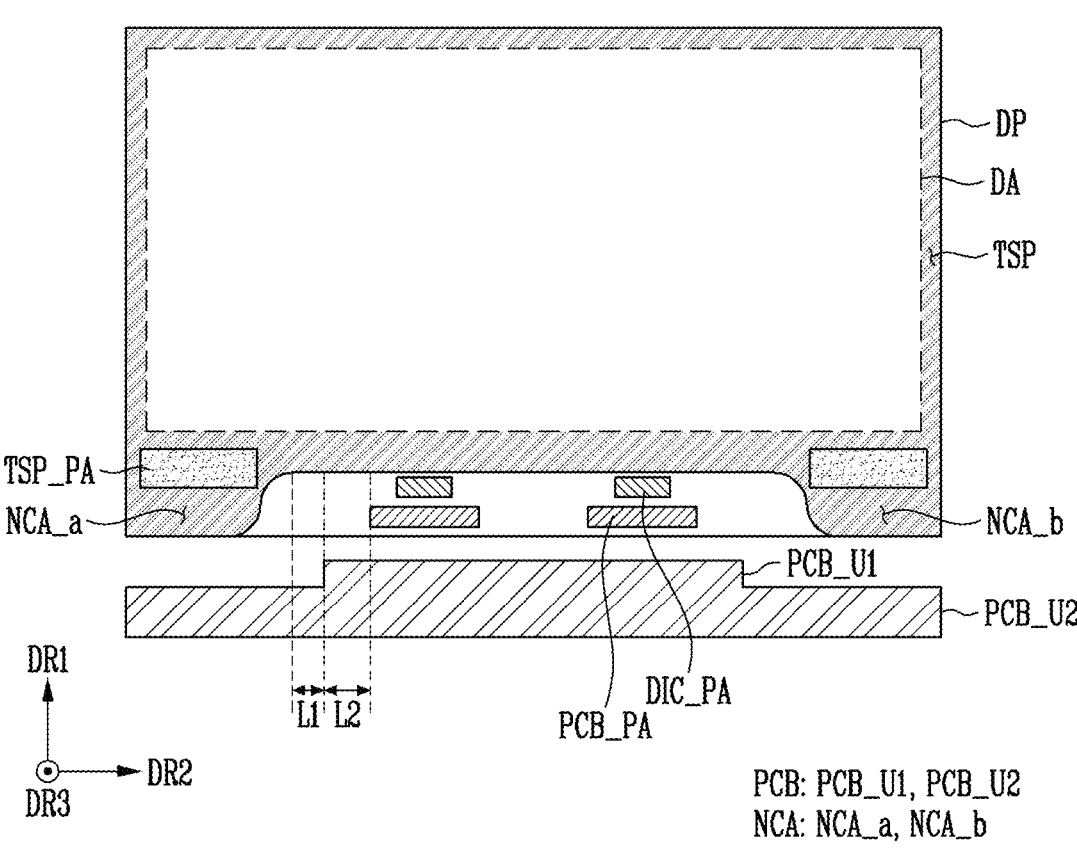

FIG. 3 is a plan view schematically showing the shape before a printed circuit board is disposed on a display panel, according to an embodiment.

Figure 4:
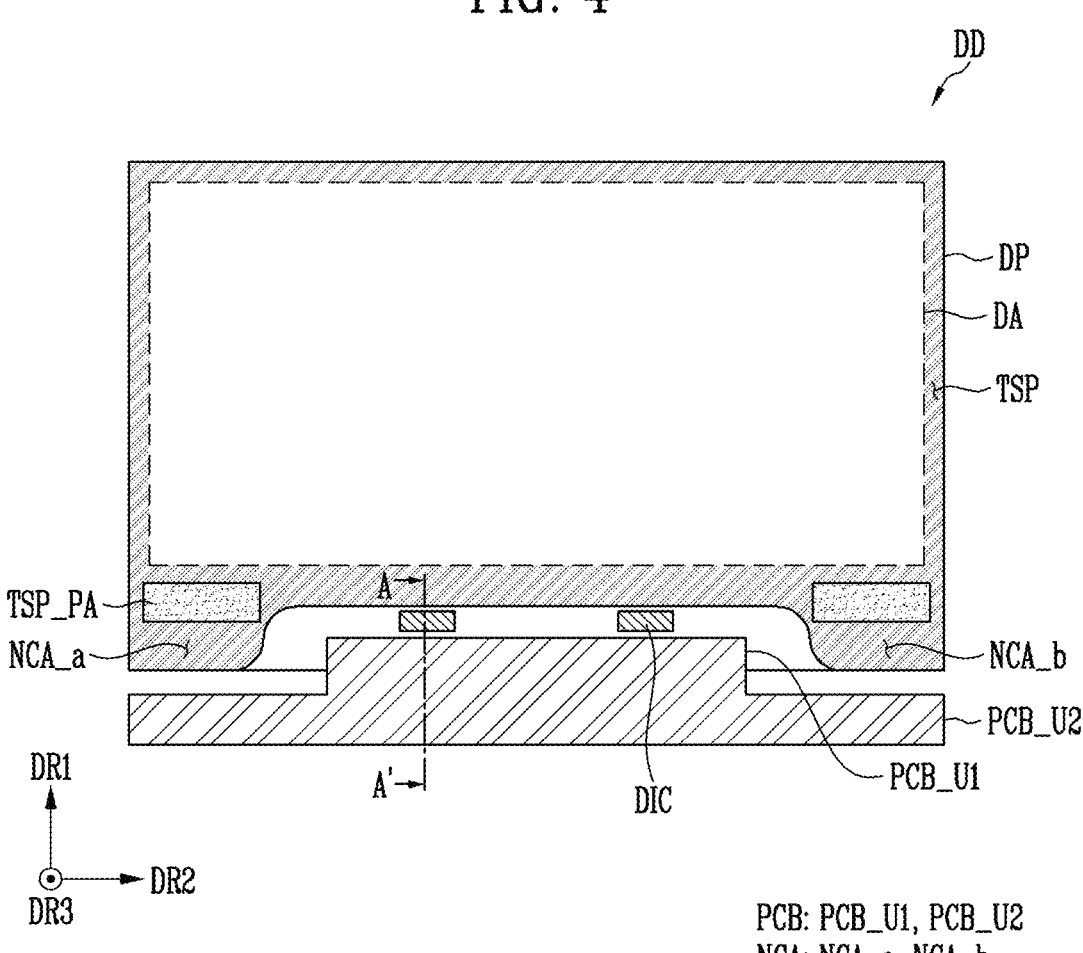

FIG. 4 is a plan view schematically showing a display device, according to an embodiment.

Figure 5:
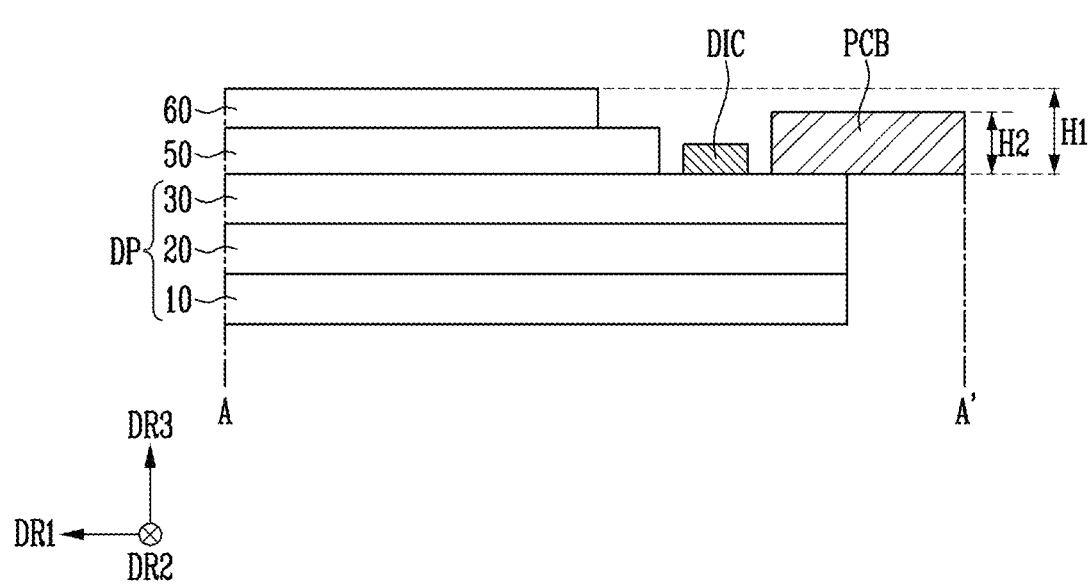

FIG. 5 is a schematic cross-sectional view of a display device according to section A-A' of FIG. 4, according to an embodiment.

Figure 6:
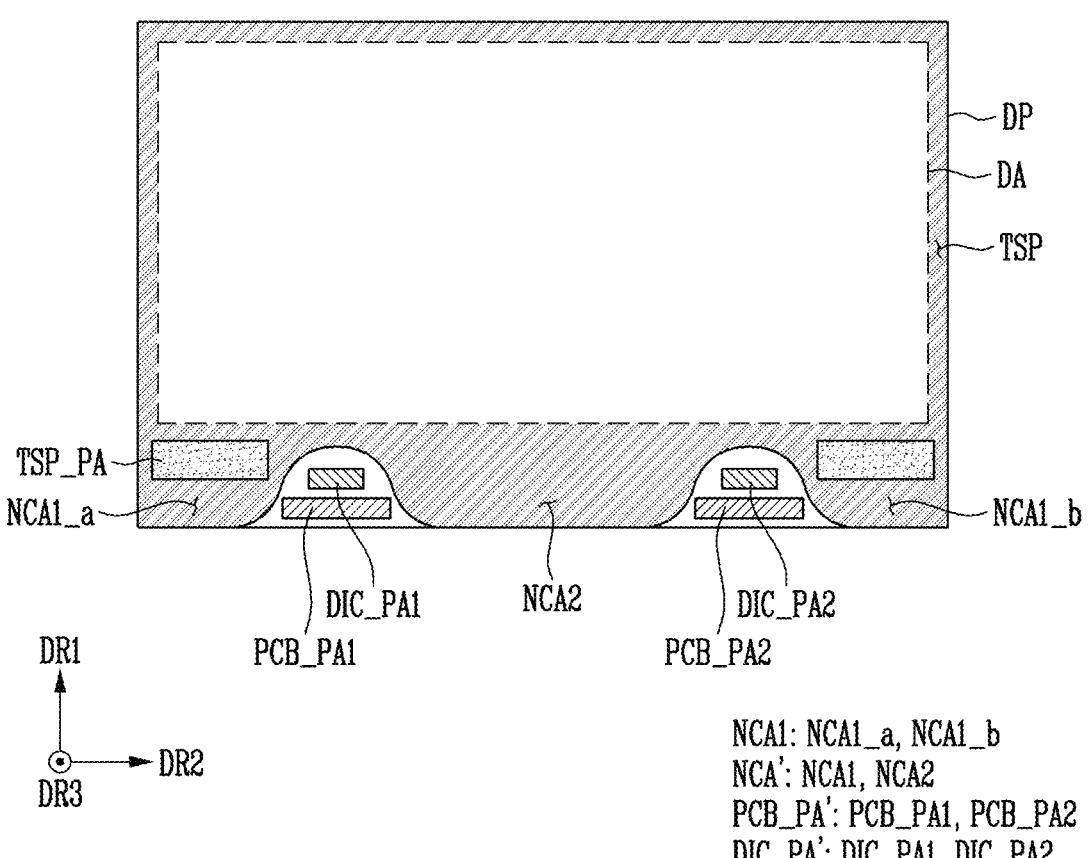

FIG. 6 is a plan view schematically showing a display panel and a touch sensor, according to an embodiment.

Figure 7:
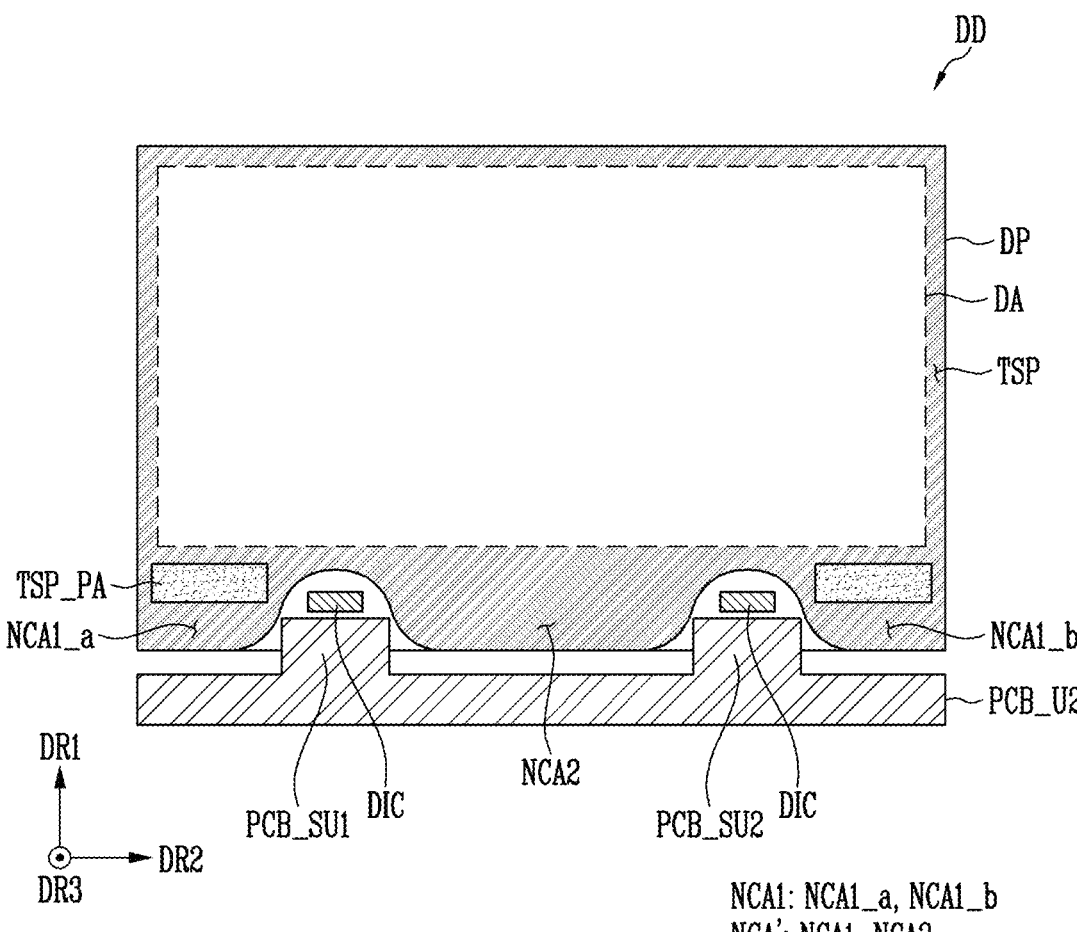

FIG. 7 is a plan view schematically showing a display device, according to an embodiment.

Figure 8:
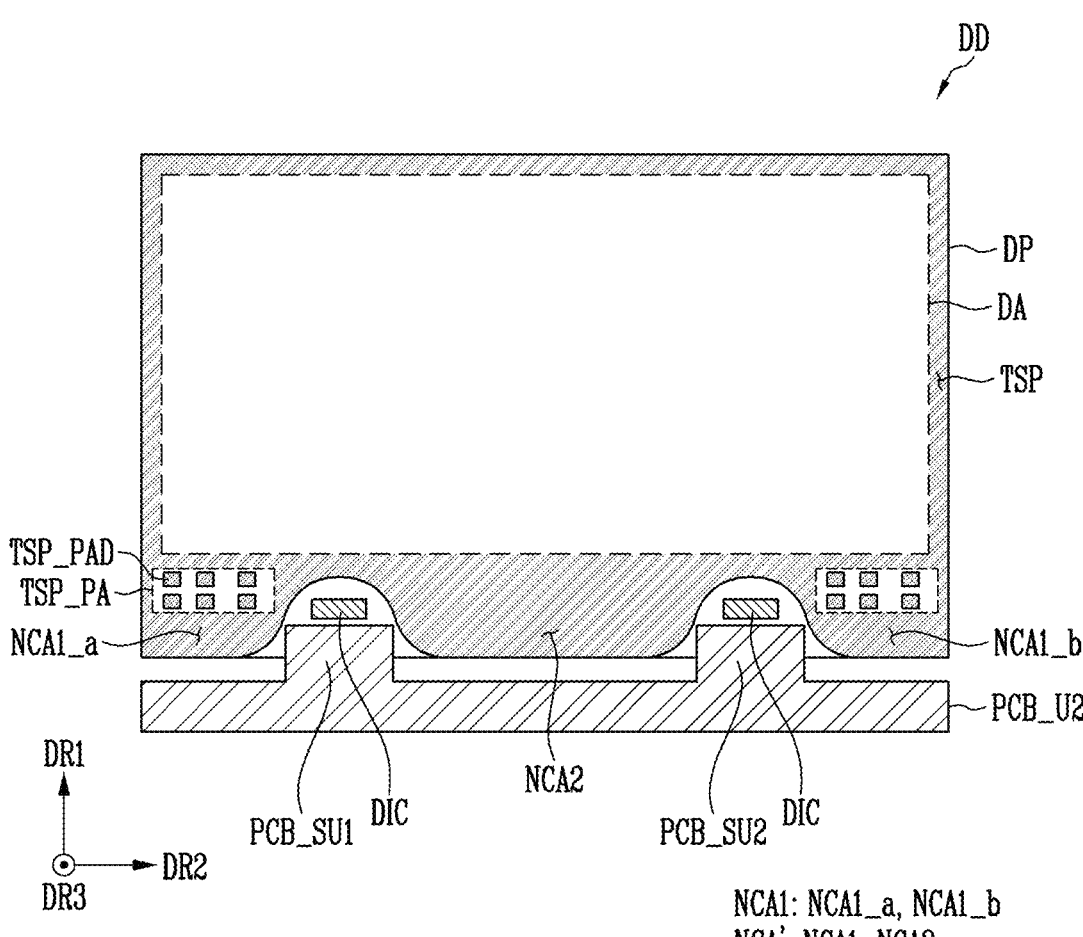

FIG. 8 is a plan view showing a touch sensor pad area of the display device of FIG. 7, according to an embodiment.

Figure 9:
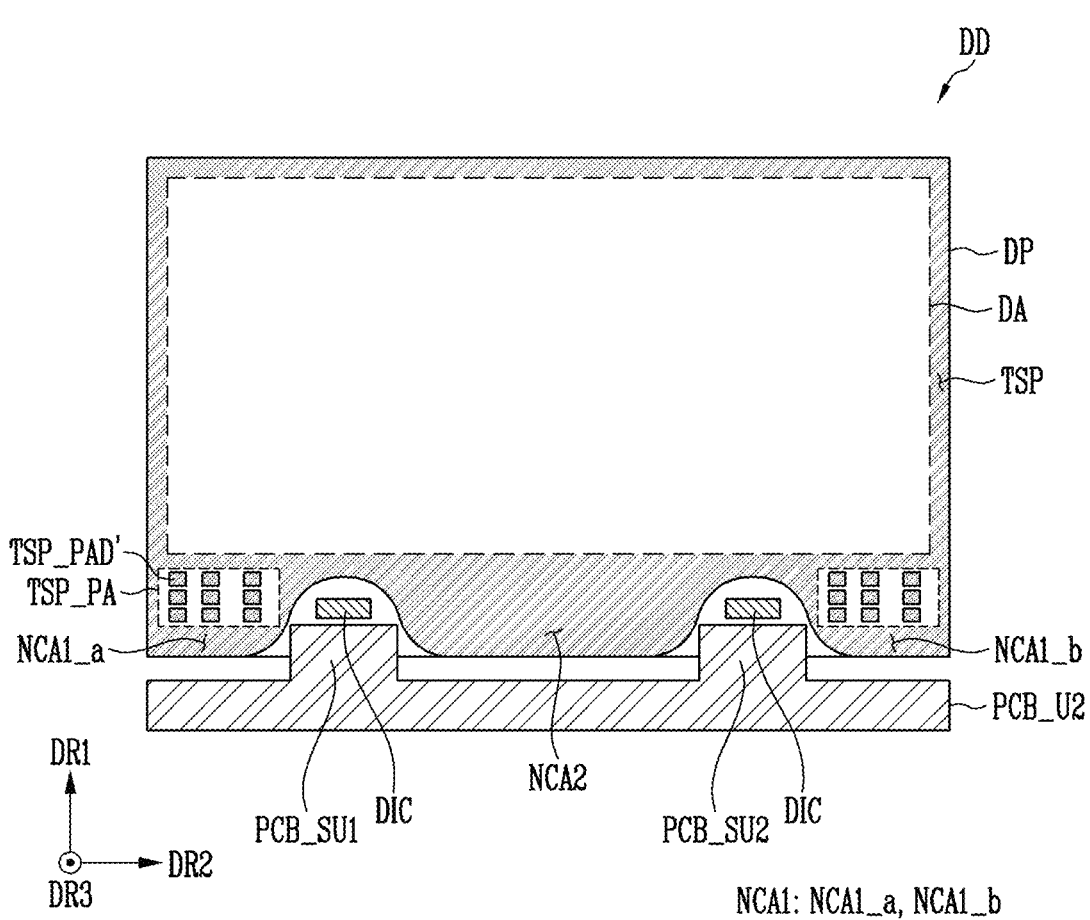

FIG. 9 is a plan view showing a touch sensor pad area of FIG. 7, according to an embodiment.

Figure 10:
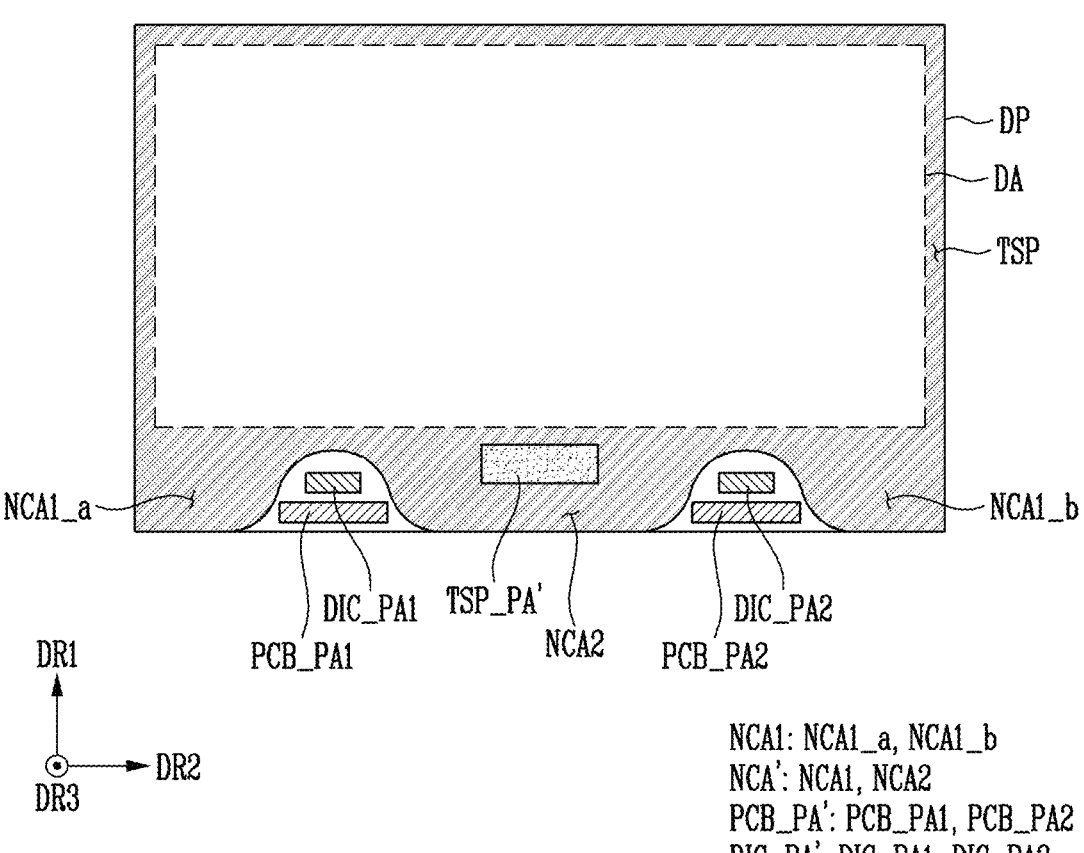

FIG. 10 is a plan view schematically showing a display panel and a touch sensor, according to an embodiment.

Figure 11:
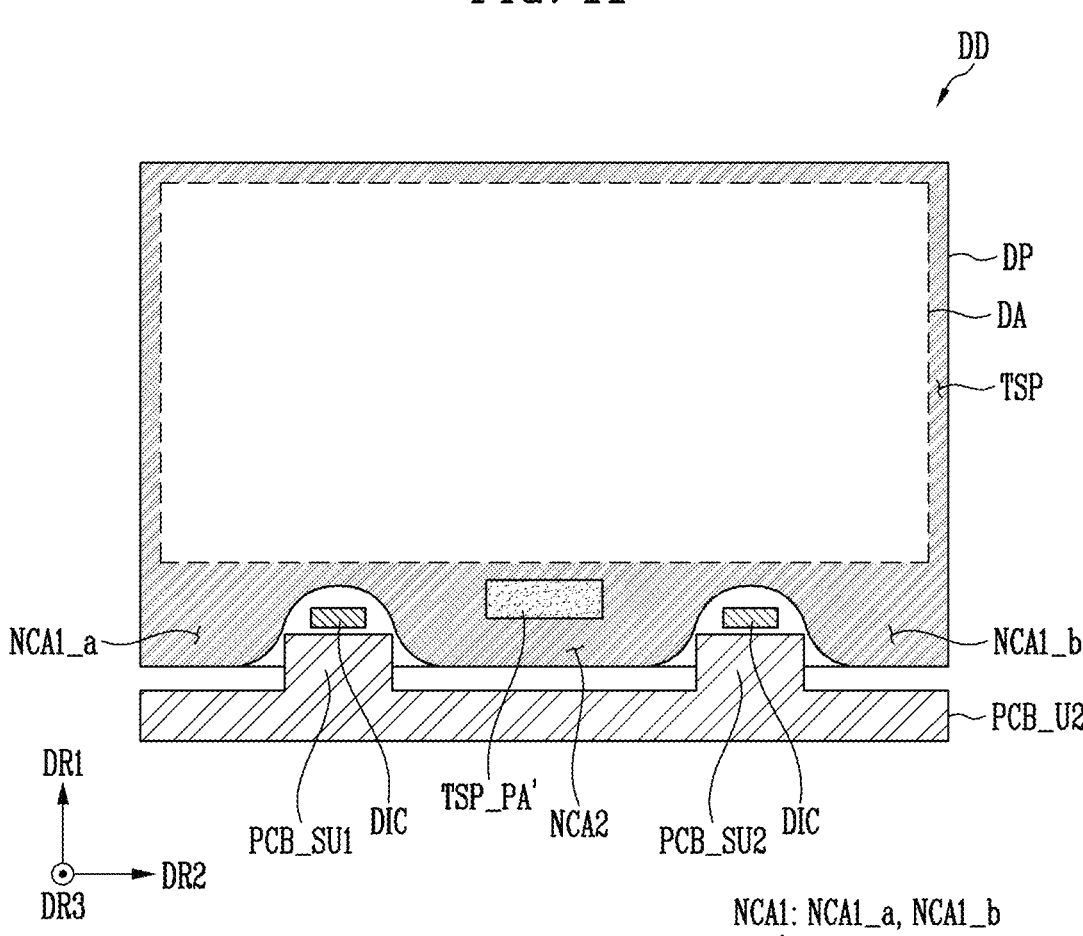

FIG. 11 is a plan view schematically showing a display device, according to an embodiment.

Figure 12:
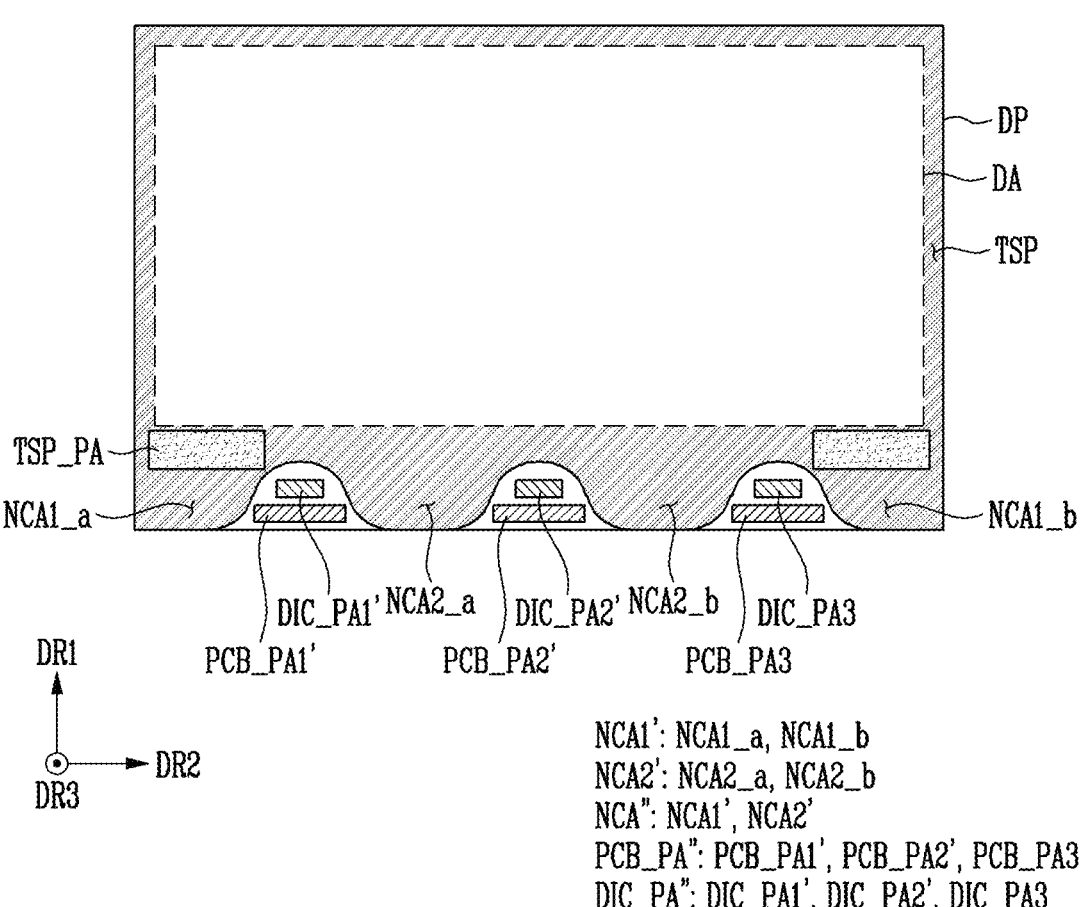

FIG. 12 is a plan view schematically showing a display panel and a touch sensor, according to an embodiment.

Figure 13:
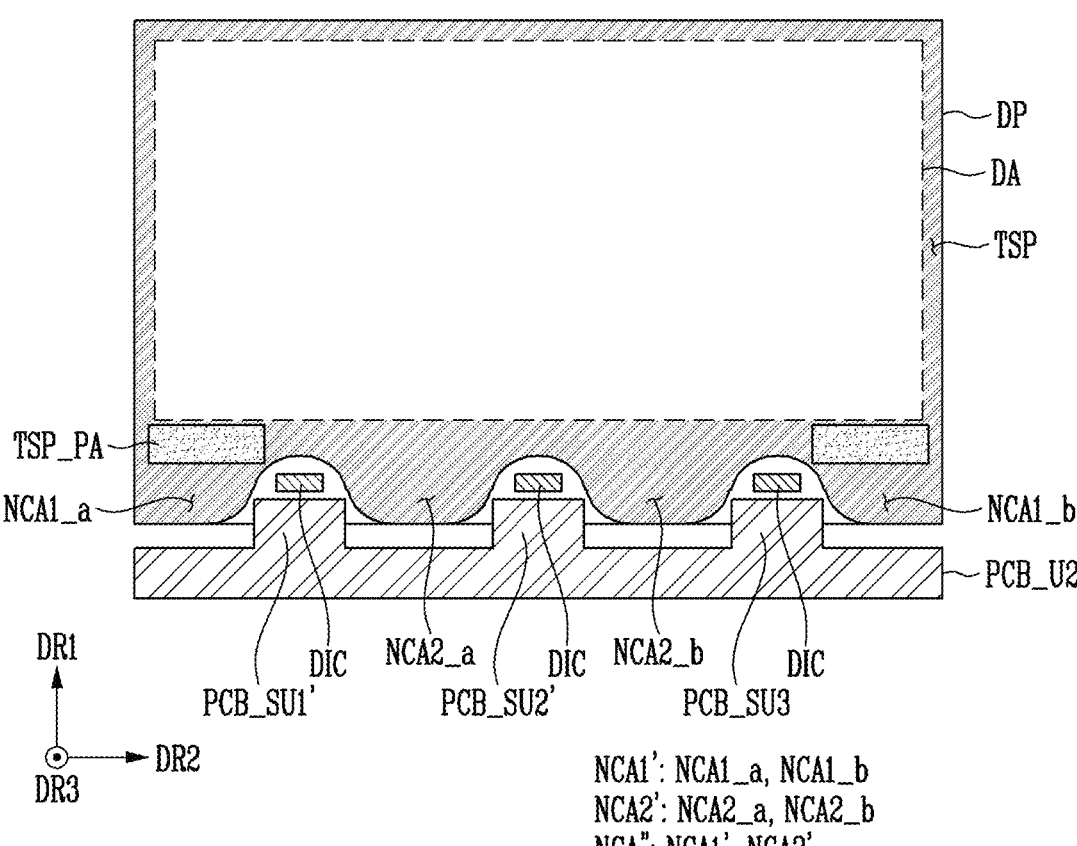

FIG. 13 is a plan view schematically showing a display device, according to an embodiment.

Figure 14:
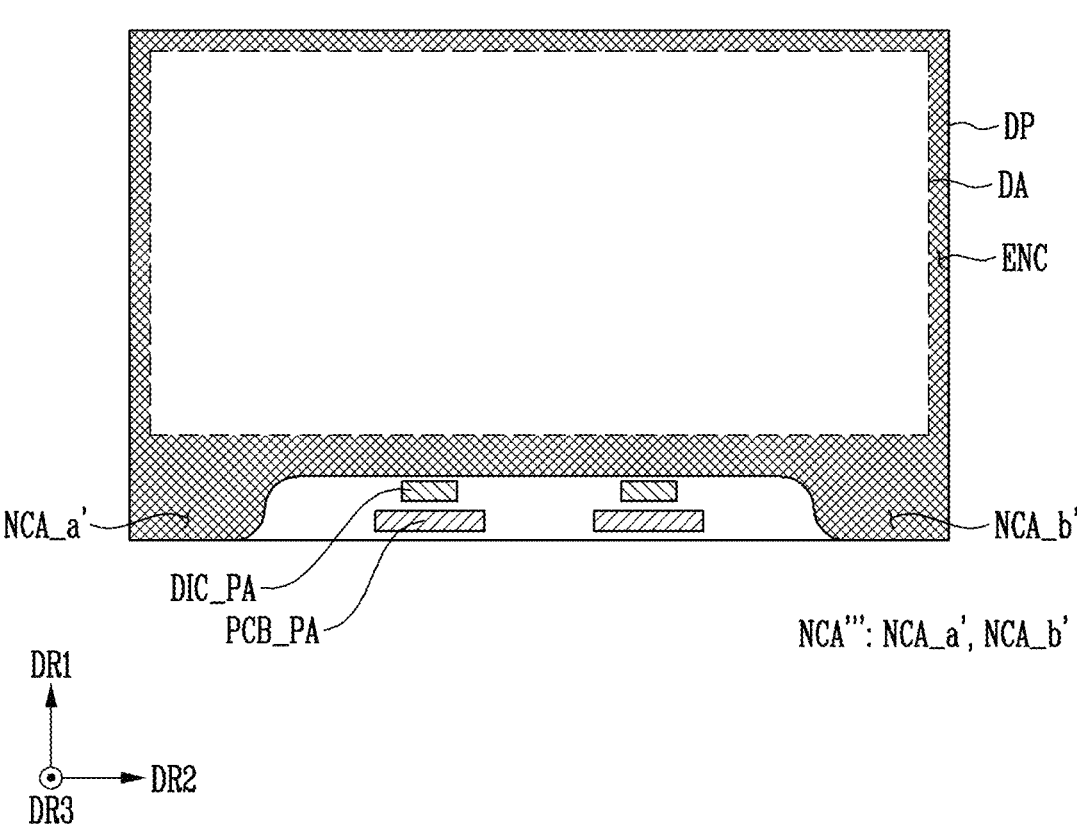

FIG. 14 is a plan view schematically showing a display panel, according to an embodiment.

Figure 15:
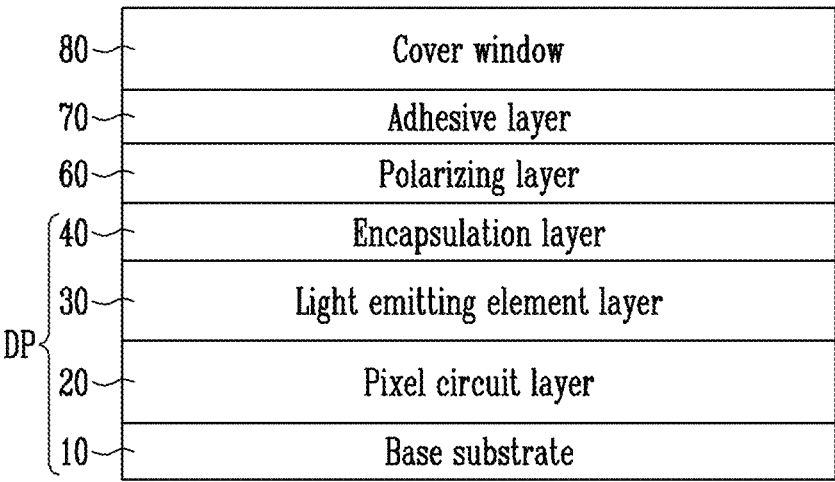

FIG. 15 is a cross-sectional view showing a laminated relationship among a display panel, a polarizing layer, an adhesive layer, and a cover window of FIG. 14, according to an embodiment.

Figure 16:
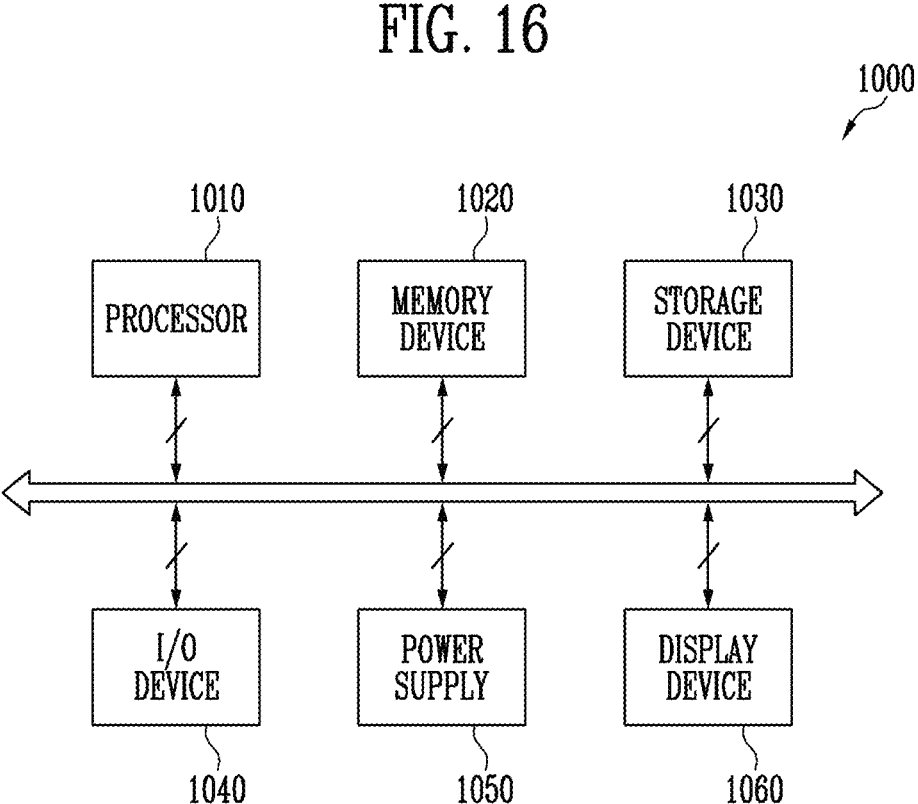

FIG. 16 is a block diagram illustrating an electronic device, according to an embodiment.

Figure 17:
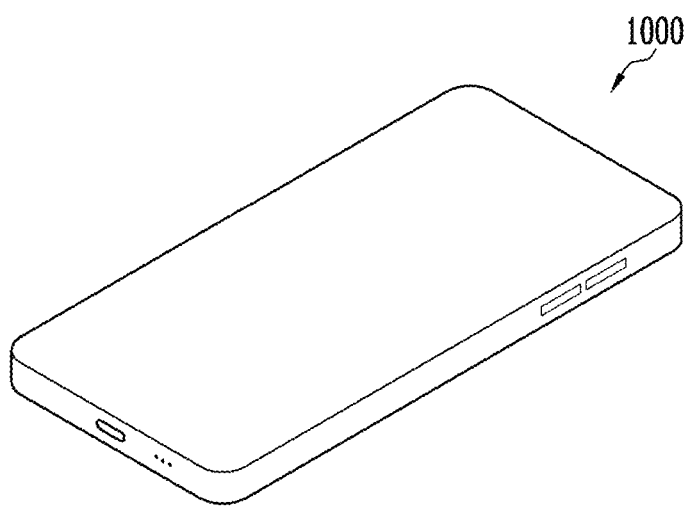

FIG. 17 is a perspective view illustrating an example in which the electronic device of FIG. 16 is implemented as a smartphone, according to an embodiment.

Figure 18:
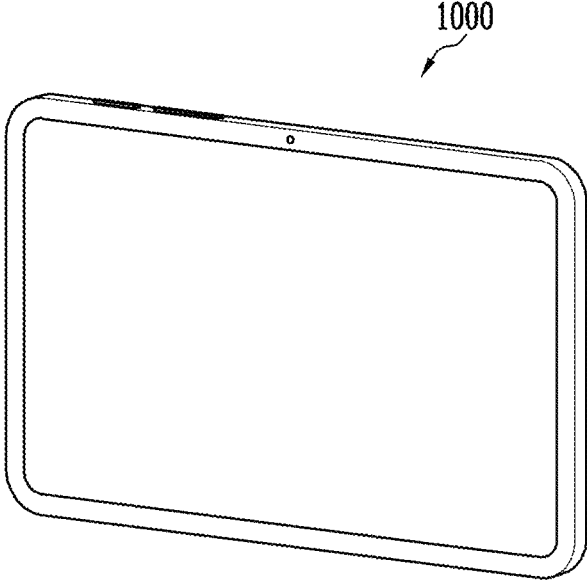

FIG. 18 is a perspective view illustrating an example in which the electronic device of FIG. 16 is implemented as a tablet PC, according to an embodiment.

DETAILED DESCRIPTION

Hereinafter, embodiments of the invention will be described in detail with reference to the accompanying drawings. In the following description, it is to be noted that only parts needed to understand the operation according to the invention will be described, and description of other parts will be omitted to avoid obscuring the gist of the invention. In addition, the invention is not limited to the embodiments described herein, and may be embodied in different forms. The embodiments described herein are provided for the purpose of describing the technical idea of the invention in sufficient detail for those of ordinary skill in the art to which the invention pertains to easily carry out the technical idea of the invention.

Throughout the specification, when it is described that an element is "connected" to another element, this includes not only being "directly connected", but also being "indirectly connected" to each other with still another element interposed therebetween. The terms used herein are for the purpose of describing specific embodiments and are not intended to limit the scope of the invention. Throughout the specification, unless specifically described to the contrary, the word "include" and variations such as "includes" or "including" will be understood to imply the inclusion of stated elements but not the exclusion of any other elements. The terms "at least one of X, Y, and Z" and "at least one selected from the group consisting of X, Y, and Z" may be construed as X only, Y only, Z only, or any combination of two or more of X, Y, and Z (e.g., XYZ, XYY, YZ, and ZZ). As used herein, the term "and/or" includes any one or all combinations of one or more of corresponding configurations.

Although the terms "first, second, and so on" may be used herein to describe various constituent elements, these constituent elements should not be limited by these terms. These terms are used to distinguish one constituent element from another. Thus, a first constituent element discussed below can be called a second constituent element without departing from the teachings of the invention.

Spatially relative terms, such as "under," "above," and the like, may be used herein for descriptive purposes, and, thereby, to describe relationships between one element or a feature and other element(s) or feature(s) as illustrated in the drawings. Spatially relative terms are intended to encompass different directions of a device when in use, operation, and/or manufacture in addition to the direction depicted in the drawings. For example, if the device in the drawings is turned over, elements described to be located "under" other elements or features are located in a direction "above" the other elements or features. Accordingly, the term "under" may include both directions of the "above" and "under." Furthermore, the device may be otherwise directed in different directions (e.g., rotated by 90 degrees or in different directions), and thus the spatially relative terms used herein are interpreted accordingly.

Various embodiments are described herein with reference to the drawings that are schematic illustrations of ideal embodiments. Accordingly, it will be expected that the shapes of the illustrations can be changed in accordance with the scope of the invention, for example, tolerances and/or manufacturing technologies. Thus, the embodiments disclosed herein should not be construed as being limited to the illustrated specific shapes but should be construed to include variations in shapes that result from, for example, manufacturing. As described above, the shapes illustrated in the drawings may not be intended to illustrate the actual shapes of areas of the device, and the invention is not limited thereto.

Figure 1:
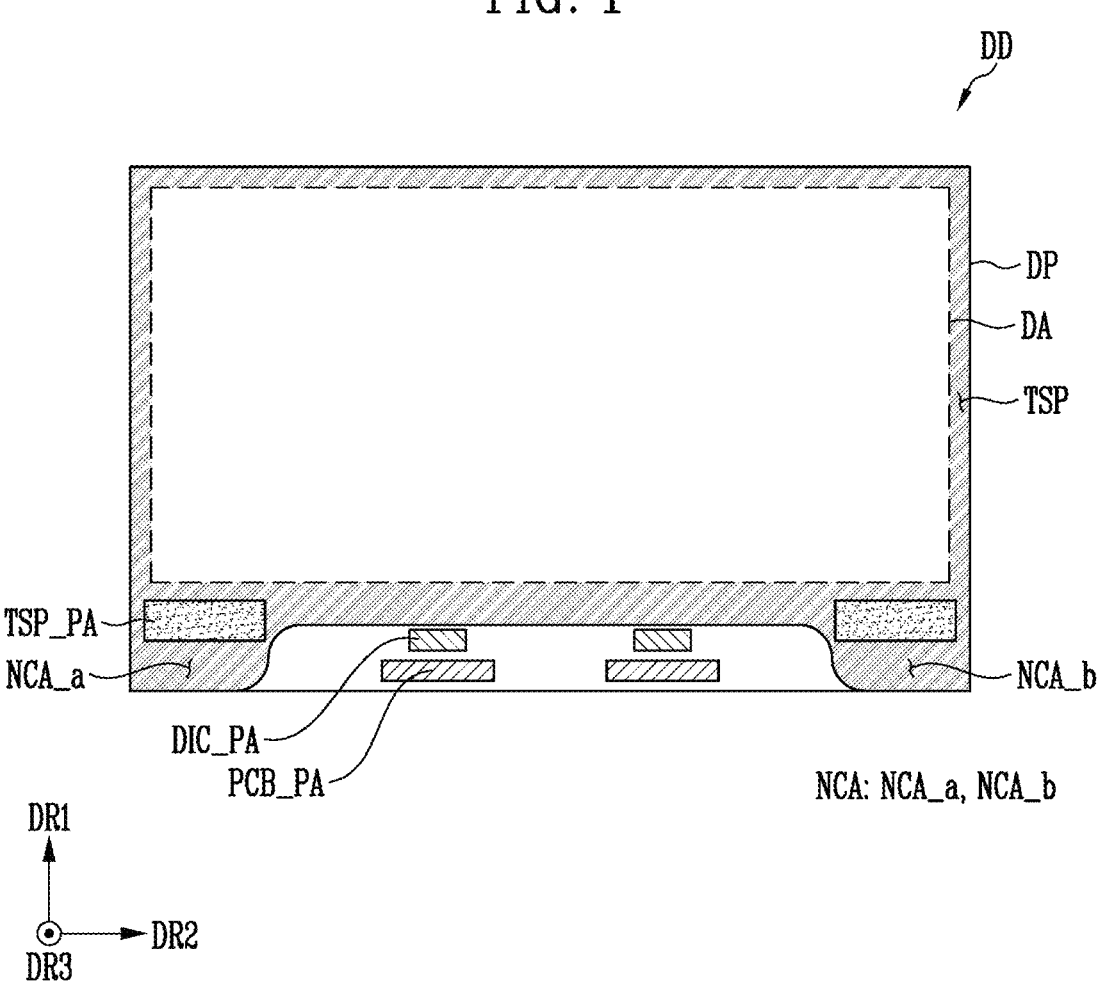
FIG. 1 is a plan view schematically showing a display panel and a touch sensor, according to an embodiment.

FIG. 1 is a plan view schematically showing a display panel and a touch sensor, according to an embodiment. FIG. 2 is a cross-sectional view schematically showing a laminated structure of a display device, according to an embodiment. FIG. 3 is a plan view schematically showing the shape before a printed circuit board is disposed on a display panel, according to an embodiment. FIG. 4 is a plan view schematically showing a display device, according to an embodiment.

In an embodiment and referring to FIGS. 1 and 2, a display device DD may include a display panel DP, a touch sensor 50, a polarizing layer 60, an adhesive layer 70, and a cover window 80.

The display panel DP may include a base substrate 10 including a display area DA, a pixel circuit layer 20 disposed on the base substrate 10, and a light emitting element layer 30 disposed on the pixel circuit layer 20.

The base substrate 10 may be a rigid substrate. For example, in an embodiment, the base substrate 10 may be made of transparent insulating materials including glass, quartz, and polymer resin. For example, the polymer resin may be polyethersulphone (PES), polyacrylate (PA), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (CAT), cellulose acetate propionate (CAP), or combinations thereof. However, the polymer resin is not limited thereto, and, in an embodiment, the base substrate 10 may be a flexible substrate having flexibility.

In the pixel circuit layer 20, transistors constituting respective pixels, a scan line, a data line, a power line, and the like may be disposed, where each of the transistors may include a gate electrode, a semiconductor layer, a source electrode, and a drain electrode.

In the light emitting element layer 30, light emitting elements which are included in the respective pixels and generate light may be disposed. For example, the light emitting element may be an organic light emitting diode (OLED) but may be a quantum dot light emitting element that emits light by changing the wavelength of the emitted light through the use of an inorganic light emitting element including an inorganic light emitting material or quantum dots.

In an embodiment and referring to FIGS. 1 to 4, the display panel DP may include a first pad area DIC_PA and a second pad area PCB_PA. The first pad area DIC_PA may be an area in which the driving IC chip DIC is disposed. The second pad area PCB_PA may be an area that overlaps at least a part of the printed circuit board PCB. In other words, the second pad area PCB_PA may be an area that overlaps one or more pads disposed on the rear surface of the printed circuit board PCB.

In an embodiment, each of the first pad area DIC_PA and the second pad area PCB_PA may be composed of a plurality of pad areas. For example, the first pad area DIC_PA may be composed of two pad areas disposed symmetrically to each other. Further, the second pad area PCB_PA may be composed of two pad areas disposed symmetrically to each other. However, this is exemplary, and the number of the pad areas is not limited thereto. For example, in an embodiment, each of the first pad area DIC_PA and the second pad area PCB_PA may be composed of one area.

In an embodiment, the first pad area DIC_PA and the second pad area PCB_PA may be in a rectangular shape on a plane. However, the shape thereof is not limited thereto. For example, in another embodiment, the first pad area DIC_PA and the second pad area PCB_PA may be in an elliptical shape.

In an embodiment, each of the first pad area DIC_PA and the second pad area PCB_PA may include one or more pads. For example, the pads of the first pad area DIC_PA may transfer electrical signals between the driving IC chip DIC and the display panel DP. Further, the pads of the second pad area PCB_PA may transfer electrical signals between the printed circuit board PCB and the display panel DP.

In an embodiment, the touch sensor 50 may be disposed on an upper surface of the display panel DP. The touch sensor 50 may be formed through a continuous process on an encapsulation layer included in the display panel DP (or in an on-cell method). For example, the touch sensor 50 may be formed by patterning sensing electrodes on the encapsulation layer. The touch sensor 50 may sense a user's touch or may recognize a user's fingerprint.

In an embodiment, the polarizing layer 60 may prevent reflection of an external light in order to improve visibility in a bright pace such as outdoors. For example, the polarizing layer 60 may include a polyethylene terephthalate (PET) film or a tri-acetyl cellulose (TAC) film as a film that can distinguish between vertically and horizontally polarized waves of an incident light and can pass or block them. The polarizing layer 60 may be attached to a lower surface of the cover window 80 by the adhesive layer 70. Accordingly, the cover window 80 may be disposed on the polarizing layer 60.

In an embodiment, the adhesive layer 70 may be a transparent adhesive material which prevents a loss of light and heightens the transmittance of light through filling of an air gap between the polarizing layer 60 and the cover window 80. For example, the adhesive layer 70 may be an optically clear adhesive (OCA).

In an embodiment, the cover window 80 may protect the display panel DP from external shocks and scratches while transmitting a video being displayed on the display panel DP. The cover window 80 may include a transparent material having stiffness and flexibility. For example, the cover window 80 may include ultra-thin glass (UTG) and colorless polyimide (CPI) (or transparent polyimide).

In an embodiment and referring to FIGS. 3 and 4, the touch sensor TSP may include the notch part NCA on a plane. The touch sensor TSP of FIGS. 3 and 4 may be substantially the same as the touch sensor 50 of FIG. 2. For example, the touch sensor TSP may include the notch part NCA that extends in an opposite direction to a first direction DR1 on a plane.

In an embodiment, the notch part NCA may include an a-th notch part NCA_a and a b-th notch part NCA_b, where the a-th notch part NCA_a and the b-th notch part NCA_b may be disposed symmetrically to each other in a second direction DR2 based on the first direction DR1.

The notch part NCA may have a curved shape with a predetermined curvature. For example, the a-th notch part NCA_a and the b-th notch part NCA_b may include curvature parts that face each other in the second direction DR2. The shape of the notch part NCA is exemplary and is not limited thereto unless the touch sensor TSP and the printed circuit board PCB do not overlap each other on a plane.

In an embodiment, the touch sensor TSP may include one or more touch sensor pad areas TSP_PA. For example, the touch sensor TSP may include the touch sensor pad areas TSP_PA disposed on the a-th notch part NCA_a and the b-th notch part NCA_b, respectively.

According to an embodiment, a first distance L1 may be equal to or larger than about 0.5 mm. In other words, the distance between one end of the a-th notch part NCA_a and an outer side of a first part PCB_U1 in an opposite direction to the second direction DR2 may be equal to or larger than about 0.5 mm. Accordingly, the first part PCB_U1 and the notch part NCA may not overlap each other on a plane.

According to an embodiment, a second distance L2 may be equal to or larger than about 3.5 mm. In other words, the distance between one side of the second pad area PCB_PA that is disposed most adjacent to the a-th notch part NCA_a and an outer side of the first part PCB_U1 in the opposite direction to the second direction DR2 may be equal to or larger than about 3.5 mm. Accordingly, the sum of the first distance L1 and the second distance L2 may be equal to or larger than about 4.0 mm. However, the sum is not limited thereto.

In an embodiment, one or more driving IC chips DIC may be disposed on one or more first pad areas DIC_PA. For example, referring to FIGS. 3 and 4, on a plane, the one or more driving IC chips DIC may overlap the one or more first pad areas DIC_PA that are disposed symmetrically to each other based on the first direction DR1.

In an embodiment, on a plane, at least a part of the printed circuit board PCB may overlap the second pad area PCB_PA. For example, the first part PCB_U1 may overlap the second pad area PCB_PA. In this case, the printed circuit board PCB may not overlap the first pad area DIC_PA.

In an embodiment, the printed circuit board PCB may include the first part PCB_U1 and a second part PCB_U2. The second part PCB_U2 may be shaped in a rectangular shape. The first part PCB_U1 may have a rectangular shape that is protruding in the first direction DR1 from the second part PCB_U2. Accordingly, the printed circuit board PCB may not overlap the touch sensor TSP. In this case, the shape of the printed circuit board PCB is exemplary and is not limited thereto. For example, the printed circuit board PCB may have various shapes that do not overlap the touch sensor TSP. In other words, the printed circuit board PCB may have various shapes that do not overlap the touch sensor TSP in order to be disposed directly on the display panel DP.

In an embodiment, on a plane, the first part PCB_U1 may not overlap the notch part NCA. The first part PCB_U1 may have a rectangular shape. In this case, one side surface (e.g., side in the second direction DR2) of the first part PCB_U1 may not come in contact with the b-th notch part NCA_b.

FIG. 5 is a schematic cross-sectional view of a display device, according to line A-A' of FIG. 4, according to an embodiment.

In an embodiment, FIG. 5 schematically illustrates constituent elements of a display device DD according to line A-A' of FIG. 4, and the display device DD may further include configurations not illustrated in FIG. 5.

In an embodiment, the base substrate 10, the pixel circuit layer 20, the light emitting element layer 30, the touch sensor 50, and the polarizing layer 60 of FIG. 5 may be described in the same manner as the base substrate 10, the pixel circuit layer 20, the light emitting element layer 30, the touch sensor 50, and the polarizing layer 60 of FIG. 2. Hereinafter, the duplicate description thereof will be omitted.

In an embodiment, the printed circuit board PCB may be disposed at one end of the display panel DP. For example, the printed circuit board PCB may be disposed directly at one end of the display panel to be directed in an opposite direction to the first direction DR1. Accordingly, the length of the display device DD in a column direction (e.g., opposite direction to the first direction DR1) of the display device DD may be shortened. For example, this may mean that a separate flexible circuit board or adhesive member is not disposed between the display panel DP and the printed circuit board PCB. In this case, the printed circuit board may extend in the opposite direction to the first direction DR1, and the length of the display device DD in the first direction DR1 may be relatively lengthened. On the contrary, according to an embodiment, the printed circuit board PCB may be disposed directly on the display panel DP, and the length of the display device DD in the opposite direction to the first direction DR1 may be relatively shortened.

In an embodiment, the thickness of the printed circuit board PCB in a third direction DR3 may be smaller than the sum of the thicknesses of the touch sensor 50 and the polarizing layer 60 in the third direction DR3. In other words, a second height H2 may be smaller than a first height H1.

According to an embodiment, the thickness of the display device DD may become relatively thin. For example, according to a comparative example, a separate configuration (e.g., flexible printed circuit board) may be disposed between the printed circuit board PCB and the display panel DP. Accordingly, the height of an upper surface of the printed circuit board PCB may be higher than an upper surface of the polarizing layer 60, and the thickness of the display device DD may become relatively thick.

On the contrary, according to an embodiment, the printed circuit board PCB may be disposed directly on the display panel DP, and the thickness of the printed circuit board PCB in the third direction DR3 may become relatively thin. Accordingly, the thickness of the display device DD may become relatively thin.

FIG. 6 is a plan view schematically showing a display panel and a touch sensor, according to another embodiment. FIG. 7 is a plan view schematically showing a display device, according to still another embodiment.

The display panel DP, the driving IC chip DIC, and the printed circuit board PCB of FIGS. 6 and 7 may be described in the same manner as the display panel DP, the driving IC chip DIC, and the printed circuit board PCB of FIG. 4. Hereinafter, the duplicate description thereof will be omitted.

In an embodiment and referring to FIGS. 6 and 7, the touch sensor TSP may include a notch part NCA' that extends in one direction, where the notch part NCA' may include first notch parts NCA1 and a second notch part NCA2.

In an embodiment, the first notch parts NCA1 may include a (1_a)-th notch part NCA1_a and a (1_b)-th notch part NCA1_b, where the (1_a)-th notch part NCA1_a and the (1_b)-th notch part NCA1_b may be disposed symmetrically to each other in the second direction DR2 based on the first direction DR1. In other words, the (1_a)-th notch part NCA1_a and the (1_b)-th notch part NCA1_b may be described in the same manner as the a-th notch part NCA_a and the b-th notch part NCA_b of FIG. 1.

In an embodiment, the second notch part NCA2 may be disposed between the first notch parts NCA1. For example, the second notch part NCA2 may extend in the opposite direction to the first direction DR1, and may be disposed between the (1_a)-th notch part NCA1_a and the (1_b)-th notch part NCA1_b.

The second notch part NCA2 may have a symmetrical shape based on the first direction DR1. For example, the second notch part NCA2 may include one curvature part that extends in the second direction DR2 from the (1_a)-th notch part NCA1_a, and the other curvature part that extends in the opposite direction to the second direction DR2 from the (1_b)-th notch part NCA1_b.

In an embodiment, the touch sensor TSP may include one or more touch sensor pad areas TSP_PA. For example, the touch sensor TSP may include the touch sensor pad areas TSP_PA disposed on the (1_a)-th notch part NCA1_a and the (1_b)-th notch part NCA1_b, respectively.

The touch sensor pad area TSP_PA may be an area that comes in contact with an outside or the printed circuit board PCB. For example, although not illustrated, at least a part of the printed circuit board PCB may come in contact with the touch sensor pad area TSP_PA. Accordingly, the touch sensor pad area TSP_PA may transfer electrical signals between the touch sensor and the outside or the printed circuit board PCB.

In an embodiment, the display panel DP may include a first pad area DIC_PA' and a second pad area PCB_PA'. The first pad area DIC_PA' may include a (1_1)-th pad area DIC_PA1 and a (1_2)-th pad area DIC_PA2) and the second pad area PCB_PA' may include a (2_1)-th pad area PCB_PA1 and a (2_2)-th pad area PCB_PA2.

In an embodiment, the first pad area DIC_PA' and the second pad area PCB_PA' may be disposed next to each other in the first direction DR1. For example, the (1_1)-th pad area DIC_PA1 may be disposed next to the (2_1)-th pad area PCB_PA1 in the first direction DR1. The (1_2)-th pad area DIC_PA2 may be disposed next to the (2_2)-th pad area PCB_PA2 in the first direction DR1.

In an embodiment, on a plane, the (1_1)-th pad area DIC_PA1 may be disposed between the (1_a)-th notch part NCA1_a and the second notch part NCA2. On a plane, the (1_2)-th pad area DIC_PA2 may be disposed between the (1_b)-th notch part NCA1_b and the second notch part NCA2.

In an embodiment, on a plane, the (2_1)-th pad area PCB_PA1 may be disposed between the (1_a)-th notch part NCA1_a and the second notch part NCA2. On a plane, the (2_2)-th pad area PCB_PA2 may be disposed between the (1_b)-th notch part NCA1_b and the second notch part NCA2.

In an embodiment, the printed circuit board PCB may include a first part PCB_U1 and a second part PCB_U2, where the first part PCB_U1 may include a first sub part PCB_SU1 and a second sub part PCB_SU2.

In an embodiment, the first part PCB_U1 may correspond to the second pad area PCB_PA'. For example, the first sub part PCB_SU1 may overlap the (2_1)-th pad area PCB_PA1 and the second sub part PCB_SU2 may overlap the (2_2)-th pad area PCB_PA2.

In an embodiment, the first sub part PCB_SU1 and the second sub part PCB_SU2 may have shapes that protrude from the second part PCB_U2. For example, the first sub part PCB_SU1 and the second sub part PCB_SU2 may be in a rectangular shape that protrudes in the first direction DR1 from the second part PCB_U2. However, this is exemplary, and the first sub part PCB_SU1 and the second sub part PCB_SU2 may be in an elliptical shape or in a square shape. Accordingly, the first sub part PCB_SU1 and the second sub part PCB_SU2 may not overlap the notch part NCA' and may overlap the second pad area PCB_PA'.

FIG. 8 is a plan view showing an embodiment of a touch sensor pad area of FIG. 7, according to an embodiment. FIG. 9 is a plan view showing the touch sensor pad area of FIG. 7, according to another embodiment.

In an embodiment and referring to FIG. 8, one or more touch sensor pad areas TSP_PA may include a plurality of touch sensor pads TSP_PAD. For example, 6 touch sensor pads TSP_PAD may be disposed on the (1_a)-th notch part NCA1_a. However, this is exemplary, and the number of touch sensor pads is not limited thereto.

In an embodiment, the touch sensor pads TSP_PAD may be disposed in two rows. For example, the touch sensor pads TSP_PAD may be sequentially arranged in the second direction DR2 to be in two rows.

In an embodiment and referring to FIG. 9, the touch sensor pads TSP_PAD' may be disposed in three rows. For example, the touch sensor pads TSP_PAD' may be sequentially arranged in the second direction DR2 in three rows. On the (1_a)-th notch part NCA1_a, 9 touch sensor pads TSP_PAD' may be disposed. However, this is exemplary, and the number of touch sensor pads is not limited thereto.

FIG. 10 is a plan view schematically showing a display panel and a touch sensor, according to still another embodiment. FIG. 11 is a plan view schematically showing a display device, according to still yet another embodiment.

In an embodiment, the display panel DP, the first pad area DIC_PA', the second pad area PCB_PA', the notch part NCA', the driving IC chip DIC, and the printed circuit board PCB of FIGS. 10 and 11 may be described in the same manner as the display panel DP, the first pad area DIC_PA', the second pad area PCB_PA', the notch part NCA', the driving IC chip DIC, and the printed circuit board PCB of FIGS. 6 and 7.

In an embodiment and referring to FIGS. 10 and 11, the touch sensor TSP may include a touch sensor pad area TSP_PA', where the touch sensor pad area TSP_PA' may be disposed on the second notch part NCA2. For example, on a plane, the touch sensor pad area TSP_PA' may be disposed between the driving IC chips DIC. However, this is exemplary, and the disposition of the touch sensor pad area TSP_PA' is not limited thereto.

In an embodiment, the touch sensor pad area TSP_PA' may include one or more pads. According to an embodiment, the touch sensor pad area TSP_PA' may include touch sensor pads disposed in two rows. However, the configuration of the touch sensor pad area TSP_PA' is not limited thereto.

FIG. 12 is a plan view schematically showing a display panel and a touch sensor, according to still yet another embodiment. FIG. 13 is a plan view schematically showing a display device, according to still yet another embodiment.

The display panel DP, a first pad area DIC_PA", a second pad area PCB_PA", the driving IC chip DIC, and the printed circuit board PCB of FIGS. 12 and 13 may be described in the same manner as the display panel DP, the first pad area DIC_PA', the second pad area PCB_PA', the driving IC chip DIC, and the printed circuit board PCB of FIGS. 6 and 7.

In an embodiment, the touch sensor TSP may include a notch part NCA". For example, the touch sensor TSP may include the notch part NCA" that extends in the opposite direction to the first direction DR1.

In an embodiment, the notch part NCA" may include a first notch part NCA1' and a second notch part NCA2'. The first notch part NCA1' of FIGS. 12 and 13 may be described in the same manner as the first notch part NCA1 of FIGS. 6 and 7. Hereinafter, the duplicate description thereof will be omitted.

In an embodiment, the second notch part NCA2' may be disposed between the first notch parts NCA1'. For example, the second notch part NCA2' may include a (2_a)-th notch part NCA2_a and a (2_b)-th notch part NCA2_b that are sequentially disposed in the second direction DR2 between the (1_a)-th notch part NCA1_a and the (1_b)-th notch part NCA1_b. In other words, the (2_a)-th notch part NCA2_a may be disposed between the (1_a)-th notch part NCA1_a and the (2_b)-th notch part NCA2_b, and the (2_b)-th notch part NCA2_b may be disposed between the (2_a)-th notch part NCA2_a and the (1_b)-th notch part NCA1_b.

In an embodiment, the display panel DP may include a first pad area DIC_PA" and a second pad area PCB_PA". The first pad area DIC_PA" may include a (1_1)-th pad area DIC_PA1', a (1_2)-th pad area DIC_PA2', and a (1_3)-th pad area DIC_PA3. The second pad area PCB_PA" may include a (2_1)-th pad area PCB_PA1', a (2_2)-th pad area PCB_PA2', and a (2_3)-th pad area PCB_PA3.

In an embodiment, on a plane, the (1_1)-th pad area DIC_PA1' may be disposed between the (1_a)-th notch part NCA1_a and the (2_a)-th notch part NCA2_a. On a plane, the (1_2)-th pad area DIC_PA2' may be disposed between the (2_a)-th notch part NCA2_a and the (2_b)-th notch part NCA2_b. On a plane, the (1_3)-th pad area DIC_PA3 may be disposed between the (2_b)-th notch part NCA2_b and the (1_b)-th notch part NCA1_b.

In an embodiment, on a plane, the (2_1)-th pad area PCB_PA1' may be disposed between the (1_a)-th notch part NCA1_a and the (2_a)-th notch part NCA2_a. On a plane, the (2_2)-th pad area PCB_PA2' may be disposed between the (2_a)-th notch part NCA2_*a* and the (2_b)-th notch part NCA2_*b*. On a plane, the (2_3)-th pad area PCB_PA3 may be disposed between the (2_b)-th notch part NCA2_*b* and the (1_b)-th notch part NCA1_*b*.

In an embodiment, the driving IC chip DIC may be disposed on the first pad area DIC_PA". For example, the driving IC chip DIC may be disposed on the (1_1)-th pad area DIC_PA1', the (1_2)-th pad area DIC_PA2', and the (1_3)-th pad area DIC_PA3, respectively.

In an embodiment, the printed circuit board PCB may include a first part PCB_U1' and a second part PCB_U2. The first part PCB_U1' may include a first sub part PCB_SU1', a second sub part PCB_SU2', and a third sub part PCB_SU3.

In an embodiment, the first part PCB_U1' may correspond to the second pad area PCB_PA". For example, the first sub part PCB_SU1' may overlap the (2_1)-th pad area PCB_PA1'. The second sub part PCB_SU2' may overlap the (2_2)-th pad area PCB_PA2'. The third sub part PCB_SU3 may overlap the (2_3)-the pad area PCB_PA3.

In an embodiment, the first sub part PCB_SU1', the second sub part PCB_SU2', and the third sub part PCB_SU3 may have shapes which protrude from the second part PCB_U2. For example, the first sub part PCB_SU1', the second sub part PCB_SU2', and the third sub part PCB_SU3 may be in a rectangular shape that protrudes in the first direction DR1 from the second part PCB_U2. Accordingly, the first sub part PCB_SU1', the second sub part PCB_SU2', and the third sub part PCB_SU3 may not overlap the notch part NCA" and may overlap the second pad area PCB_PA".

FIG. 14 is a plan view schematically showing a display panel, according to an embodiment. FIG. 15 is a cross-sectional view showing a laminated relationship among a display panel, a polarizing layer, an adhesive layer, and a cover window of FIG. 14, according to an embodiment.

In an embodiment and referring to FIG. 14, a display panel DP may include a display area DA, a first pad area DIC_PA, a second pad area PCB_PA, and an encapsulation layer ENC.

The first pad area DIC_PA and the second pad area PCB_PA of FIG. 14 may be described in the same manner as the first pad area DIC_PA and the second pad area PCB_PA of FIGS. 3 and 4. For example, the printed circuit board PCB (refer to FIG. 4) may be disposed on the second pad area PCB_PA.

In an embodiment, the encapsulation layer ENC may protect the display panel from the outside. For example, the encapsulation layer ENC may suppress the characteristic deterioration of the light emitting element by sealing the light emitting element from an outdoor environment including moisture and oxygen. The encapsulation layer ENC may be transparent rigid glass. However, the encapsulation layer ENC is not necessarily limited thereto, and may be formed as a thin film encapsulation layer including at least one inorganic film and an organic film and having flexibility.

In an embodiment, the encapsulation layer ENC may include a notch part NCA'''. For example, the encapsulation layer ENC may include the notch part NCA''' that extends in the first direction DR1 from the encapsulation layer ENC.

In an embodiment, the notch part NCA''' may include an a-th notch part NCA_a' and a b-th notch part NCA_b'. The a-th notch part NCA_a' and the b-th notch part NCA_b' may be disposed symmetrically to each other in the second direction DR2 based on the first direction DR1.

In an embodiment, the notch part NCA''' may have a curved shape with a predetermined curvature. For example, the a-th notch part NCA_a' and the b-th notch part NCA_b' may include curvature parts that face each other in the second direction DR2. However, the shape of the notch part NCA''' is exemplary and is not limited thereto unless the encapsulation layer ENC and the printed circuit board PCB (refer to FIG. 4) do not overlap each other on a plane. In other words, the encapsulation layer ENC may be shaped to not come in contact with the printed circuit board PCB. For example, the notch part NCA''' of the encapsulation layer ENC may be in a curved shape, and the encapsulation layer ENC may not come in contact with the first part PCB_U1 and the second part PCB_U2 of the printed circuit board PCB. Accordingly, the length of the display device DD (refer to FIG. 4) in a column direction (e.g., the first direction DR1) of the display device DD may be shortened. For example, this may mean that a separate flexible circuit board or adhesive member is not disposed between the display panel DP and the printed circuit board PCB. In this case, the flexible circuit board may extend in the opposite direction to the first direction DR1, and the length of the display device DD in the first direction DR1 may be relatively lengthened. On the contrary, according to an embodiment, the printed circuit board PCB may be disposed directly on the display panel DP, and the length of the display device DD in the opposite direction to the first direction DR1 may be relatively shortened.

In an embodiment and referring to FIG. 15, the display device including the display panel DP of FIG. 14 may include the display panel DP, a polarizing layer 60, an adhesive layer 70, and a cover window 80, where the display panel DP may include a base substrate 10, a pixel circuit layer 20, a light emitting element layer 30, and an encapsulation layer 40.

The base substrate 10, the pixel circuit layer 20, the light emitting element layer 30, the polarizing layer 60, the adhesive layer 70, and the cover window 80 of FIG. 15 may be described in the same manner as the base substrate 10, the pixel circuit layer 20, the light emitting element layer 30, the polarizing layer 60, the adhesive layer 70, and the cover window 80 of FIG. 2. Further, the encapsulation layer 40 of FIG. 15 may be described in the same manner as the encapsulation layer ENC of FIG. 14.

FIG. 16 is a block diagram illustrating an electronic device, according to an embodiment. FIG. 17 is a view illustrating an example in which the electronic device of FIG. 16 is implemented as a smartphone, according to an embodiment. FIG. 18 is a view illustrating an example in which the electronic device of FIG. 16 is implemented as a tablet PC, according to an embodiment.

In an embodiment and referring to FIGS. 16 to 18, an electronic device 1000 may include a processor 1010, a memory device 1020, a storage device 1030, an input/output device 1040, a power supply 1050, and a display device 1060. In this case, the display device 1060 may be the display device DD of FIG. 3. Further, the electronic device may further include several ports which can communicate with a video card, a sound card, a memory card, and a USB device, or can communicate with other systems. In an embodiment, as illustrated in FIG. 17, the electronic device 1000 may be implemented as a smartphone. In another embodiment, as illustrated in FIG. 18, the electronic device 1000 may be implemented as a tablet PC. However, this is exemplary, and the electronic device 1000 is not limited thereto. For example, the electronic device 1000 may be implemented as a cellular phone, a video phone, a smart pad, a smart watch, navigation for a vehicle, a computer monitor, a notebook computer, and a head mount display device.

In an embodiment, the processor 1010 may perform specific calculations or tasks. According to an embodiment, the processor 1010 may be a microprocessor, a central processing unit, or an application processor. The processor 1010 may be connected to other constituent elements through an address bus, a control bus, and a data bus. According to an embodiment, the processor 1010 may be connected even to an expansion bus, such as a peripheral component interconnect (PCI) bus.

In an embodiment, the memory device 1020 may store therein data required for the operation of the electronic device 1000. For example, the memory device 1020 may include a nonvolatile memory device, such as an erasable programmable read-only memory (EPROM) device, an electrically erasable programmable read-only memory (EE-PROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, and a ferroelectric random access memory (FRAM) device, and/or a volatile memory device, such as a dynamic random access memory (DRAM) device, a static random access memory (SRAM) device, and a mobile DRAM device.

In an embodiment, the storage device 1030 may include a solid state drive (SSD), a hard disk drive (HDD), and a CD-ROM.

In an embodiment, the input/output device 1040 may include an input means, such as a keyboard, a keypad, a touchpad, a touchscreen, and a mouse, and an output means, such as a speaker and a printer. According to an embodiment, the display device 1060 may be included in the input/output device 1040.

In an embodiment, the power supply 1050 may supply a power required for the operation of the electronic device 1000. For example, the power supply 1050 may be a power management integrated circuit (PMIC).

In an embodiment, the display device 1060 may display a video corresponding to visual information of the electronic device 1000. In this case, the display device 1060 may be an organic light emitting display device or a quantum dot light emitting display device, but is not limited thereto. The display device 1060 may be connected to other constituent elements through the buses or other communication links.

Although specific embodiments and application examples have been described herein, other embodiments and modifications can be derived from the above description. Accordingly, the scope of the invention is not limited to the disclosed embodiments. Moreover, example embodiments have been disclosed herein, and although specific terms are employed, they are used and are to be interpreted in a generic and descriptive sense only and not for purpose of limitation. In some instances, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the invention. Thus, while various embodiments have been described above, those skilled in the art will appreciate that various modifications, additions and substitutions are possible, without departing from the scope and spirit of the invention.

What is claimed is:

1. A display device comprising:
a display panel including a display area and one or more pad areas;
a touch sensor disposed on the display panel and including a notch part;
a polarizing layer disposed on the touch sensor; and
a printed circuit board disposed on the display panel and configured to overlap at least a part of the one or more pad areas,
wherein the notch part is configured to extend in a first direction from the display area in a plane and to not overlap the one or more pad areas in the plane.

2. The display device of claim 1, further comprising one or more touch sensor pad areas disposed on the notch part.

3. The display device of claim 2, wherein the printed circuit board comprises:
a first part configured to extend in an opposite direction to the first direction on the floor plan and to overlap the one or more pad areas; and
a second part configured to not overlap the one or more pad areas,
wherein the first part is configured to not overlap the notch part on the floor plan.

4. The display device of claim 3, wherein each of the one or more pad areas comprises:
a first pad area on which a driving IC chip is disposed; and
a second pad area configured to overlap the first part,
wherein the first part is configured to not overlap the first pad area on the floor plan.

5. The display device of claim 4, wherein on the floor plan, a distance between one side of the second pad area that is disposed most adjacent to the notch part and an outer side in a second direction that crosses the first direction on the first part is equal to or larger than about 3.5 mm.

6. The display device of claim 5, wherein a distance between one end of the notch part and the outer side is at least equal to or larger than about 0.5 mm.

7. The display device of claim 4, wherein the notch part comprises:
first notch parts symmetrically disposed in a second direction that crosses the first direction; and
a second notch part disposed between the first notch parts.

8. The display device of claim 7, wherein the second pad area comprises:
a (2_1)-th pad area disposed between any one of the first notch parts and the second notch part; and
a (2_2)-th pad area disposed between the other of the first notch parts and the second notch part.

9. The display device of claim 8, wherein the first part comprises:
a first sub part configured to overlap the (2_1)-th pad area; and
a second sub part configured to overlap the (2_2)-th pad area.

10. The display device of claim 9, wherein each of the one or more touch sensor pad areas is disposed on an upper surface of each of the first notch parts.

11. The display device of claim 9, wherein each of the one or more touch sensor pad areas is disposed on an upper surface of the second notch part.

12. The display device of claim 9, wherein the one or more touch sensor pad areas comprise a plurality of touch sensor pads disposed in two rows.

13. The display device of claim 9, wherein the one or more touch sensor pad areas comprise a plurality of touch sensor pads disposed in three rows.

14. The display device of claim 1, wherein a thickness of the printed circuit board is not larger than a sum of a thickness of the touch sensor and a thickness of the polarizing layer.

15. The display device of claim 1, wherein the printed circuit board is disposed directly on the display panel.

16. A display device comprising:

a display panel including a display area and one or more pad areas;

an encapsulation layer disposed on the display panel and including a notch part;

a polarizing layer disposed on the encapsulation layer; and a printed circuit board disposed directly on the display panel and configured to overlap at least a part of the one or more pad areas, wherein the notch part is configured to extend in a first direction from the display area in a plane and to not overlap the pad area in the plane.

17. An electronic device comprising:

a processor configured to provide input video data to a display device, wherein the display device is configured to display a video based on the input video data, and wherein the display device includes:

a display panel including a display area and one or more pad areas;

a touch sensor disposed on the display panel and including a notch part;

a polarizing layer disposed on the touch sensor; and a printed circuit board disposed on the display panel and configured to overlap at least a part of the one or more pad areas, wherein the notch part is configured to extend in a first direction from the display area in a plane and to not overlap the pad area in the plane.

* * * * *